(12) United States Patent
Takahashi et al.

(10) Patent No.: US 10,189,745 B2
(45) Date of Patent: Jan. 29, 2019

(54) CORROSION-RESISTANT MEMBER AND ELECTROSTATIC CHUCK DEVICE

(71) Applicant: Sumitomo Osaka Cement Co., Ltd., Tokyo (JP)

(72) Inventors: Kentaro Takahashi, Tokyo (JP); Yoshiaki Moriya, Tokyo (JP); Megumi Ootomo, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 297 days.

(21) Appl. No.: 15/027,339

(22) PCT Filed: Oct. 15, 2014

(86) PCT No.: PCT/JP2014/077413
§ 371 (c)(1),
(2) Date: Apr. 5, 2016

(87) PCT Pub. No.: WO2015/056702
PCT Pub. Date: Apr. 23, 2015

(65) Prior Publication Data
US 2016/0251265 A1    Sep. 1, 2016

(30) Foreign Application Priority Data

Oct. 15, 2013   (JP) .................... 2013-214637

(51) Int. Cl.
*C04B 35/44*   (2006.01)
*H01L 21/683*   (2006.01)
(Continued)

(52) U.S. Cl.
CPC .......... *C04B 35/44* (2013.01); *C04B 35/6261* (2013.01); *C04B 35/6262* (2013.01);
(Continued)

(58) Field of Classification Search
CPC .. C04B 35/44; C04B 35/6261; C04B 35/6262
See application file for complete search history.

(56) References Cited

U.S. PATENT DOCUMENTS 5,241,191 A * 8/1993 Agostinelli ......... C04B 35/4504
505/329
5,824,278 A * 10/1998 Yao ....................... C01B 13/363
423/263

(Continued)

FOREIGN PATENT DOCUMENTS

JP   H06191929 A   7/1994
JP   H10236871 A   9/1998
(Continued)

OTHER PUBLICATIONS

International Search Report of PCT/JP2014/077413 dated Jan. 20, 2015.

*Primary Examiner* — Scott Bauer
(74) *Attorney, Agent, or Firm* — Merchant & Gould P.C.

(57) ABSTRACT

Provided are a corrosion-resistant member and an electrostatic chuck device using the same, in which corrosion resistance to halogen corrosive gas such as fluorine corrosive gas or chlorine corrosive gas and plasma thereof is high, dielectric constant and volume resistivity are high, and dielectric loss is low. The corrosion-resistant member is formed of a composite oxide sintered compact containing aluminum, samarium, and a rare earth metal element other than samarium, in which the rare earth metal element other than samarium has an ionic radius of $0.88 \times 10^{-10}$ m or more.

6 Claims, 1 Drawing Sheet

(51) Int. Cl.
    *C04B 35/645*     (2006.01)
    *H02N 13/00*     (2006.01)
    *H05K 7/20*     (2006.01)
    *H01L 21/687*     (2006.01)
    *C04B 35/626*     (2006.01)

(52) U.S. Cl.
CPC .. *C04B 35/62655* (2013.01); *C04B 35/62675* (2013.01); *C04B 35/645* (2013.01); *H01L 21/6831* (2013.01); *H01L 21/6833* (2013.01); *H01L 21/68757* (2013.01); *H02N 13/00* (2013.01); *H05K 7/2039* (2013.01); *C04B 2235/3217* (2013.01); *C04B 2235/3222* (2013.01); *C04B 2235/3224* (2013.01); *C04B 2235/3225* (2013.01); *C04B 2235/3227* (2013.01); *C04B 2235/5436* (2013.01); *C04B 2235/5445* (2013.01); *C04B 2235/761* (2013.01); *C04B 2235/764* (2013.01); *C04B 2235/768* (2013.01); *C04B 2235/77* (2013.01); *C04B 2235/9669* (2013.01); *C04B 2235/9684* (2013.01); *C04B 2235/9692* (2013.01)

(56) References Cited

U.S. PATENT DOCUMENTS

| | | | |
|---|---|---|---|
| 2004/0171474 A1* | 9/2004 | Kobayashi | C01B 21/0602 501/98.4 |
| 2010/0128409 A1* | 5/2010 | Teratani | C04B 35/581 361/234 |
| 2011/0149462 A1* | 6/2011 | Kugimoto | H01L 21/6831 361/234 |

FOREIGN PATENT DOCUMENTS

| | | |
|---|---|---|
| JP | H11157916 A | 6/1999 |
| JP | 2011-151336 A | 8/2011 |
| JP | 2012-094826 A | 5/2012 |
| WO | WO 2013/114654 A1 | 8/2013 |

* cited by examiner

CORROSION-RESISTANT MEMBER AND ELECTROSTATIC CHUCK DEVICE

TECHNICAL FIELD

The present invention relates to a corrosion-resistant member and an electrostatic chuck device.

This application is a U.S. National Stage Application under 35 U.S.C. § 371 of International Application No. PCT/JP2014/077413 filed Oct. 15, 2014, which claims the benefit of priority to Japanese Patent Application No. 2013-214637 filed on Oct. 15, 2013, the contents of all of which are hereby incorporated by reference in their entireties.

BACKGROUND ART

In the related art, in a manufacturing line for a semiconductor device such as IC, LSI, or VLSI, there are processes in which halogen corrosive gas such as fluorine corrosive gas or chlorine corrosive gas and plasma thereof are used. In particular, for example, in steps of dry etching, plasma etching, and cleaning, fluorine gas such as $CF_4$, $SF_6$, HF, $NF_3$, or $F_2$ or chlorine gas such as $Cl_2$, $SiCl_4$, $BCl_3$, or HCl is used. Therefore, improvement of corrosion resistance to the corrosive gas and plasma thereof is required for constituent members in a semiconductor manufacturing device. In particular, satisfactory corrosion resistance is required for an electrostatic chuck member among the constituent members in the semiconductor manufacturing device.

Therefore, in the related art, as a corrosion-resistant material used for the electrostatic chuck member, a rare earth metal oxide, a cubic garnet type yttrium aluminum oxide (yttrium aluminum garnet: $5Al_2O_3 \cdot 3Y_2O_3$, YAG), a sintered compact of YAG to which a rare earth metal oxide other than yttrium is added is used (for example, refer to Patent Literature Nos. 1 and 2).

CITATION LIST

Patent Literature

[Patent Literature No. 1] Japanese Laid-open Patent Publication No. H10-236871
[Patent Literature No. 2] Japanese Laid-open Patent Publication No. H11-157916

SUMMARY OF INVENTION

Technical Problem

However, the dielectric constant of YAG is low at 10.7. Therefore, in a case where a sintered compact of YAG is applied to a dielectric layer of an electrostatic chuck member, there is a problem in that adsorption force is low.

On the other hand, in $REAlO_3$ (RE represents a rare earth metal element), a high dielectric constant can be expected as long as a structure thereof as a perovskite phase can be controlled. $REAlO_3$ can be synthesized by heating an equimolar mixture of $RE_2O_3$ and $Al_2O_3$. However, on surfaces of the obtained $REAlO_3$ particles, a large amount of defects are present, and dielectric loss is high. Therefore, in a case where a $REAlO_3$ sintered compact is applied to a dielectric layer of an electrostatic chuck member, there is a problem in that residual adsorption force is high.

The present invention has been made in order to solve the above-described problems, and an object thereof is to provide a corrosion-resistant member and an electrostatic chuck device using the same, in which corrosion resistance to halogen corrosive gas such as fluorine corrosive gas or chlorine corrosive gas and plasma thereof is high, dielectric constant and volume resistivity are high, and dielectric loss is low.

Solution to Problem

As a result of thorough investigation for solving the above-described problems, the present inventors found that, by substituting a portion of samarium in the samarium-aluminum oxide sintered compact with the rare earth metal element other than samarium having an ionic radius of $0.88 \times 10^{-10}$ m or more, a $REAlO_3$ sintered compact having a high dielectric constant, high volume resistivity, and low dielectric loss can be obtained, thereby completing the present invention.

That is, according to the present invention, there is provided a corrosion-resistant member including a composite oxide sintered compact containing aluminum, samarium, and a rare earth metal element other than samarium, in which the rare earth metal element other than samarium has an ionic radius of $0.88 \times 10^{-10}$ m or more.

According to the present invention, there is provided an electrostatic chuck device including: a ceramic plate-shaped body that has one main surface which is a placement surface on which a sample is placed; and an internal electrode for electrostatic adsorption that is provided on an other main surface of the ceramic plate-shaped body, in which the ceramic plate-shaped body is formed of the corrosion-resistant member according to the present invention.

Advantageous Effects of Invention

According to the present invention, a corrosion-resistant member can be provided in which corrosion resistance to halogen corrosive gas and plasma thereof is high, dielectric constant and volume resistivity are high, and dielectric loss is low.

DESCRIPTION OF EMBODIMENTS

An embodiment of a corrosion-resistant member and an electrostatic chuck device using the same according to the present invention will be described.

The embodiment will be described in detail for easy understanding of the concept of the present invention, but the present invention is not limited thereto unless specified otherwise.

[Corrosion-Resistant Member]

A corrosion-resistant member according to the embodiment is formed of a composite oxide sintered compact containing aluminum, samarium, and a rare earth metal element other than samarium, in which the rare earth metal element other than samarium has an ionic radius of $0.88 \times 10^{-10}$ m or more.

It is preferable that the corrosion-resistant member according to the embodiment is formed of a composite oxide sintered compact containing an orthorhombic perovskite phase which is obtained by substituting a portion of samarium (Sm) in a samarium-aluminum oxide ($SmAlO_3$)

with a rare earth metal element (RE) other than samarium (Sm) to form a solid solution.

That is, the composite oxide contains: a $SmAlO_3$ crystal phase which is obtained by substituting a portion of samarium oxide ($Sm_2O_3$) in a samarium-aluminum oxide ($SmAlO_3$) crystal with an oxide of a rare earth metal element (RE) other than samarium (Sm) (hereinafter, also referred to as a rare earth metal oxide ($RE_2O_3$)) to form a solid solution; and an orthorhombic crystal phase containing aluminum oxide (alumina: $Al_2O_3$) and a rare earth metal oxide ($RE_2O_3$).

Here, the above-described rare earth metal oxide is represented by $RE_2O_3$. However, in the case of lanthanoid (Ln), for example, a divalent oxide (LnO) or a tetravalent oxide ($LnO_2$) may be adopted in addition to a trivalent oxide ($Ln_2O_3$). For example, in the case of samarium (Sm), europium (Eu), or ytterbium (Yb), a divalent oxide SmO, EuO, or YbO can be adopted. In the case of praseodymium (Pr), an oxide having a high oxidation number ($Pr_6O_{11}$) is stable. Therefore, the rare earth metal oxide is generally represented by $RE_2O_3$ and, as necessary, is represented by, for example, REO.

The rare earth metal element other than samarium is not particularly limited as long as it has an ionic radius of $0.88 \times 10^{-10}$ m or more, and examples thereof include elements pertaining to Group 3 in the periodic table such as yttrium (Y), lanthanum (La) of lanthanoid (Ln), praseodymium (Pr), neodymium (Nd), promethium (Pm), europium (Eu), gadolinium (Gd), terbium (Tb), dysprosium (Dy), holmium (Ho), erbium (Er), thulium (Tm), ytterbium (Yb), and lutetium (Lu). From the viewpoint of improving availability and corrosion resistance, it is preferable that the rare earth metal element other than samarium is one element or two or more elements selected from the group consisting of yttrium (Y), lanthanum (La), praseodymium (Pr), neodymium (Nd), europium (Eu), gadolinium (Gd), terbium (Tb), dysprosium (Dy), holmium (Ho), erbium (Er), and thulium (Tm). In particular, from the viewpoint of improving dielectric constant, volume resistivity, and dielectric loss, yttrium (Y) or neodymium (Nd) is preferable.

In the composite oxide, the rare earth metal oxide ($RE_2O_3$) added to the samarium-aluminum oxide ($SmAlO_3$) may form a solid solution with $SmAlO_3$ or may be present as a secondary phase in a grain boundary of $SmAlO_3$. However, it is preferable that the rare earth metal oxide forms a solid solution with $SmAlO_3$.

As a result, the crystal phase of the composite oxide is an orthorhombic perovskite phase.

In addition, in the composite oxide, a portion of samarium (Sm) in the samarium-aluminum oxide (SmAlO3) is substituted with the rare earth metal element (RE) other than samarium (Sm) having an ionic radius different from that of samarium. As a result, the lattice constant satisfies $a=5.200 \times 10^{-10}$ m or more and $5.350 \times 10^{10}$ m or less, $b=5.200 \times 10^{10}$ m or more and $5.350 \times 10^{10}$ m or less, and $c=7.400 \times 10^{-1}$ m or more and $7.550 \times 10^{-10}$ m or less.

The corrosion-resistant member according to the embodiment can be manufactured, for example, as follows.

First, as starting materials, aluminum oxide ($Al_2O_3$) powder having a purity of 99% or higher and having an average primary particle size of 0.01 μm or more and 5 μm or less, samarium oxide ($Sm_2O_3$) powder having a purity of 99% or higher and having an average primary particle size of 0.01 μm or more and 5 μm or less, and rare earth metal oxide ($RE_2O_3$) powder other than samarium oxide ($Sm_2O_3$) are mixed with each other at predetermined ratio.

For example, the components are added such that: the total amount of the samarium oxide ($Sm_2O_3$) powder and the rare earth metal oxide ($RE_2O_3$) powder other than samarium oxide ($Sm_2O_3$) is 1 mol with respect to 1 mol of the aluminum oxide ($Al_2O_3$) powder; and 1 mol of the total amount of the components is composed of 0.01 mol or more and 0.5 mol or less of the rare earth metal oxide ($RE_2O_3$) powder other than samarium oxide ($Sm_2O_3$) and a balance of the samarium oxide ($Sm_2O_3$).

In the composite oxide (corrosion-resistant member), in order to secure the production of a sufficient amount of the orthorhombic perovskite phase, it is preferable that the material powders are mixed such that a ratio ($N_{RE}/(N_{SM}+N_{RE})$) of the number of atoms of the rare earth metal element other than samarium ($N_{RE}$) to the sum ($N_{SM}+N_{RE}$) of the number of atoms of samarium ($N_{SM}$) and the number of atoms of the rare earth metal element other than samarium ($N_{RE}$) is 0.01 or higher and 0.5 or lower.

The amount of the crystal phase produced varies depending on, for example, the mix ratio of the material powders, mixing conditions, and calcination conditions. Therefore, it is preferable that the above conditions are set in advance in a preliminary experiment.

Next, this mixed powder is pre-calcinated (pre-calcination).

This mixed powder may be formed and calcinated as it is to obtain a sintered compact without being pre-calcinated, but there maybe a variation in the composition of the mixed powder. In addition, when the mixed powder, which is not preliminarily calcinated, is main-calcinated directly, aluminum (Al) in the aluminum oxide (Al2O3) powder evaporates, and a sintered compact having a desired composition may not be obtained.

Accordingly, in order to stably obtain a sintered compact having a desired composition, it is preferable that the above-described mixed powder is pre-calcinated at a temperature of 800° C. or higher and 1800° C. or lower and then is crushed into a particle size of 1 μm or less to be used as a pre-calcinated powder.

As necessary, for example, an organic binder such as polyvinyl alcohol (PVA), ethyl cellulose, or an acrylic binder may be added to the pre-calcinated powder.

Next, this pre-calcinated powder or granulated powder is formed into a predetermined shape using known forming means.

Next, this compact is degreased at 50° C. or higher and 300° C. or lower in air, in a vacuum, or in an inert gas atmosphere and then is calcinated at 1400° C. or higher and 1800° C. or lower, preferably, 1550° C. or higher and 1750° C. or lower in air, in a vacuum, or in an inert gas atmosphere for 1 hour to 10 hours. As a result, a dense sintered compact (composite oxide sintered compact) having a sintered density of 98% or higher can be manufactured. The obtained composite oxide sintered compact is the corrosion-resistant member according to the embodiment.

As a calcination method, normal-pressure calcination may be used, but in order to obtain a dense sintered compact, press calcination such as hot press or hot isostatic press (HIP) is preferable. During the pressure calcination, the welding pressure is not particularly limited but is typically about 10 MPa or higher and 40 MPa or lower.

In the corrosion-resistant member according to the embodiment, a dielectric constant at a frequency of 1 MHz or lower is 13 or higher, a dielectric loss at a frequency of 1 MHz or lower is 0.2 or lower, and volume resistivity is $1 \times 10^{14}$ Ω·cm or higher. In addition, corrosion resistance to halogen corrosive gas and plasma thereof is high, dielectric constant and volume resistivity are high, and dielectric loss is low.

[Electrostatic Chuck Device]

Figure 1:
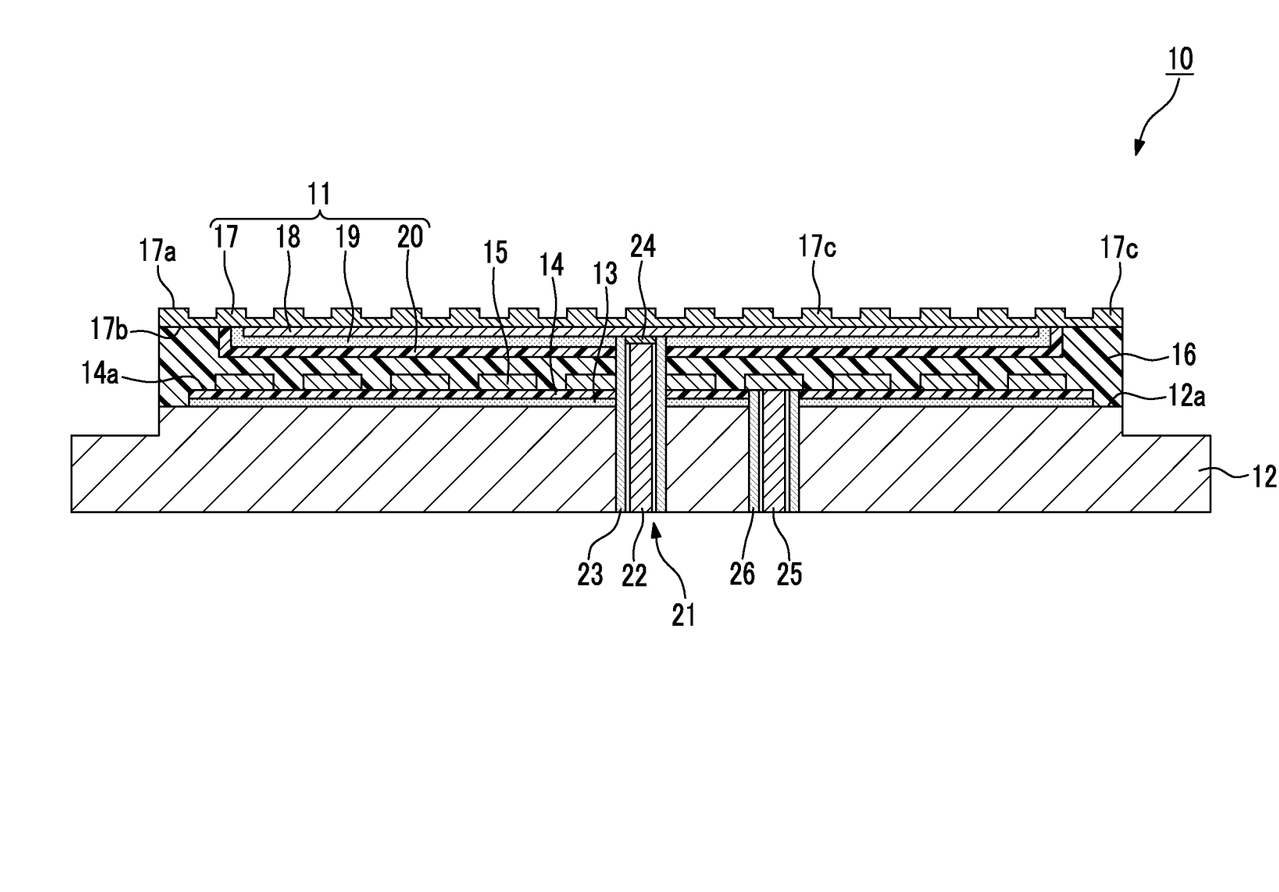
FIG. 1 is a schematic cross-sectional view showing an embodiment of an electrostatic chuck device according to the present invention.

FIG. 1 is a schematic cross-sectional view showing an example of an electrostatic chuck device according to the embodiment.

An electrostatic chuck device 10 according to the embodiment is schematically configured to include: a disk-shaped electrostatic chuck portion 11; a disk-shaped thick cooling base portion 12 that adjusts a temperature of the electrostatic chuck portion 11 to a desired value; an insulating member 14 that is adhered to a top surface 12a of the cooling base portion 12 through an adhesive 13; a heater element (heating member) 15 that is provided on a bottom surface (an other main surface) side of the electrostatic chuck portion 11 and a top surface 14a of the insulating member 14 in a predetermined pattern; and an organic adhesive layer 16 through which the electrostatic chuck portion 11 and the heater element 15 on the cooling base portion 12 are adhered to each other and integrated in a state of being opposite to each other.

The electrostatic chuck portion 11 is schematically configured to include: a placement plate (ceramic plate-shaped body) 17 having a top surface (one main surface) 17a as a placement surface on which a plate-shaped sample such as a semiconductor wafer is placed; an internal electrode 18 for electrostatic adsorption that is provided on a bottom surface (an other main surface) 17b of the placement plate 17; an insulating member 20 that is adhered to a periphery of the internal electrode 18 for electrostatic adsorption on the bottom surface 17b of the placement plate 17 through an adhesive 19; and a power feeding terminal 21 that applies a direct current voltage to the internal electrode 18 for electrostatic adsorption and is provided so as to pass through the adhesive 19, the insulating member 20, the organic adhesive layer 16, the second adhesive 13, the second insulating member 14, and the cooling base portion 12.

The insulating member 20 covers the periphery of the internal electrode 18 for electrostatic adsorption (a surface of the internal electrode 18 for electrostatic adsorption other than a surface in contact with the placement plate 17) through the adhesive 19. As a result, the placement plate 17 and the internal electrode 18 for electrostatic adsorption are integrated.

The placement plate 17 has a disk shape and is formed of the corrosion-resistant member according to the embodiment.

On the placement surface (top surface (one main surface)) 17a of the placement plate 17, plural protrusions 17c are provided at predetermined intervals. These protrusions 17c are configured to support the plate-shaped sample such as a semiconductor wafer.

The internal electrode 18 for electrostatic adsorption is used as an electrode for an electrostatic chuck that generates charges and fixes the plate-shaped sample due to an electrostatic adsorption force, and the shape and size thereof are appropriately adjusted according to the intended use.

The internal electrode 18 for electrostatic adsorption is formed of a conductive ceramic such as an aluminum oxide-tantalum carbide ($Al_2O_3$—$Ta_4C_5$) conductive composite sintered compact, an aluminum oxide-tungsten ($Al_2O_3$—W) conductive composite sintered compact, an aluminum oxide-silicon carbide ($Al_2O_3$—SiC) conductive composite sintered compact, an aluminum nitride-tungsten (AlN—W) conductive composite sintered compact, an aluminum nitride-tantalum (AlN—Ta) conductive composite sintered compact, or an yttrium oxide-molybdenum ($Y_2O_3$—Mo) conductive composite sintered compact; high melting point metal such as tungsten (W), tantalum (Ta), or molybdenum (Mo); or a resin containing a conductive material such as silver (Ag) or carbon.

The adhesive 19 is interposed between the internal electrode 18 for electrostatic adsorption and the insulating member 20 and adheres the insulating member 20 to the periphery of the internal electrode 18 for electrostatic adsorption.

As the adhesive 19, for example, a sheet-shaped or film-shaped adhesive resin having heat resistance and insulating characteristics such as a polyimide resin, a silicone resin, or an epoxy resin is used.

The insulating member 20 surrounds the internal electrode 18 for electrostatic adsorption through the adhesive 19, protects the internal electrode 18 for electrostatic adsorption from corrosive gas and plasma thereof, and allows the placement plate 17 and the internal electrode 18 for electrostatic adsorption to be adhered to each other and integrated.

The insulating member 20 is not particularly limited as long as it has heat resistance, insulating characteristics, and satisfactory durability to corrosive gas and plasma thereof. For example, the insulating member 20 is formed of a polyimide sheet.

The power feeding terminal 21 is a columnar member which is provided to apply a direct current voltage to the internal electrode 18 for electrostatic adsorption. The power feeding terminal 21 includes a columnar electrode 22 and an insulator 23 having insulating characteristics.

A material of the columnar electrode 22 is not particularly limited as long as it is a conductive material having satisfactory heat resistance. However, a material having a thermal expansion coefficient similar to that of the internal electrode 18 for electrostatic adsorption is preferable. For example, a corrosion-resistant member constituting the internal electrode 18 for electrostatic adsorption or a metal material such as tungsten (W), tantalum (Ta), molybdenum (Mo), niobium (Nb), or a cobalt alloy is preferably used.

The columnar electrode 22 is insulated from the cooling base portion 12 by the insulator 23 having insulating characteristics.

In addition, the columnar electrode 22 is connected to the internal electrode 18 for electrostatic adsorption through a conductive adhesive 24.

The power feeding terminal 21 and the insulating member 20 are adhered to each other and integrated to constitute the electrostatic chuck portion 11.

The cooling base portion 12 is a thick disk-shaped member which adjusts a temperature of the electrostatic chuck portion 11 to a desired value.

As the cooling base portion 12, for example, a water-cooling base in which a flow path (not shown) for circulating water is formed is preferable.

A material constituting the cooling base portion 12 is not particularly limited as long as it is metal having satisfactory thermal conductivity, electrical conductivity, and workability or a compound material containing the metal. For example, aluminum (Al), an aluminum alloy, copper (Cu), a copper alloy, or stainless use steel (SUS) is preferably used. It is preferable that a surface of the cooling base portion 12 undergoes an alumite treatment or that an insulating film such as alumina is formed on the surface of the cooling base portion 12.

A metal foil-shaped electrode 25 for applying a direct current voltage to the heater element 15 is provided so as to pass through the second adhesive 13, the second insulating member 14, and the cooling base portion 12. It is preferable that the electrode 25 is a metal foil. However, if thermal stress can be relaxed, the electrode 25 may be a metal fiber or a metal stranded wire. It is preferable that the heater element 15 and the electrode 25 are connected to each other by welding. However, as long as conductivity and adhesion strength are sufficient, the heater element 15 and the electrode 25 may be connected to each other through, for example, a conductive adhesive.

The electrode 25 is insulated from the cooling base portion 12 by an insulator 26 having insulating characteristics. A gap between the electrode 25 and the insulator 26 may be filled with a low-elasticity adhesive such as a silicon resin. Further, the low-elasticity adhesive may contain a filler formed of an inorganic oxide, an inorganic nitride, or an inorganic oxynitride. It is preferable that the filler is formed of surface-coated aluminum nitride (AlN) particles formed by forming a coating layer formed of silicon oxide ($SiO_2$) on surfaces of aluminum nitride (AlN) particles or aluminum oxide ($Al_2O_3$) particles.

A material of the electrode 25 is not particularly limited as long as it is a conductive material having satisfactory heat resistance. However, a material having a thermal expansion coefficient similar to that of the heater element 15 is preferable. For example, a metal foil formed of a non-magnetic metal material constituting the heater element 15 is preferably used.

The adhesive 13 is interposed between the cooling base portion 12 and the insulating member 14 and adheres the insulating member 14 to the top surface 12a of the cooling base portion 12.

As the adhesive 13, for example, a sheet-shaped or film-shaped adhesive resin having heat resistance and insulating characteristics such as a polyimide resin, a silicone resin, or an epoxy resin is used.

The insulating member 14 is interposed between the cooling base portion 12 and the heater element 15 and insulates the cooling base portion 12 and the heater element 15 from each other.

The insulating member 14 is not particularly limited as long as it has insulating characteristics, voltage endurance, and satisfactory durability to corrosive gas and plasma thereof. For example, the insulating member 14 is formed of a polyimide sheet.

The thermal conductivity of the insulating member 14 is preferably 0.05 W/mk or higher and 0.5 W/mk or lower and more preferably 0.1 W/mk or higher and 0.25 W/mk or lower.

Here, it is not preferable that the thermal conductivity is lower than 0.1 W/mk because heat transfer from the electrostatic chuck portion 11 to the cooling base portion 12 through the insulating member 14 is suppressed, and the cooling rate decreases. On the other hand, it is not preferable that the thermal conductivity is higher than 1 W/mk because heat transfer from the heater portion to the cooling base portion 12 through the insulating member 14 is promoted, and the temperature increase rate decreases.

The heater element 15 is provided on the top surface 12a of the cooling base portion 12 through the adhesive 13 and the insulating member 14.

In the heater element 15, for example, a meandering pattern of a belt-shaped metal material having a narrow width is repeatedly arranged around an axis, and adjacent patterns are connected to each other, thereby forming one continuous belt-shaped heater pattern.

In addition, the reason why the heater element 15 is preferably formed of non-magnetic metal is as follows. Even when the electrostatic chuck device 10 is used in a high-frequency atmosphere, the heater element 15 does not self-heat due to high-frequency. Therefore, it is easy to maintain the in-plane temperature of the plate-shaped sample, which is placed on the top surface 17a of the placement plate 17, to be a desired constant temperature or a constant temperature pattern.

In addition, when the heater element 15 is formed using a non-magnetic metal thin plate having a constant thickness, the thickness of the heater element 15 is constant over the entire region of a heating surface. Further, since the amount of heat generation is constant over the entire region of a heating surface, the temperature distribution in the placement surface (the top surface 17a of the placement plate 17) of the electrostatic chuck portion 11 can be made to be uniform.

Through the organic adhesive layer 16, the electrostatic chuck portion 11 and the heater element 15 on the cooling base portion 12 are adhered to each other and integrated in a state of being opposite to each other. In addition, the organic adhesive layer 16 has a thermal stress relaxation effect.

The organic adhesive layer 16 is formed of, for example, a cured product obtained by thermally curing a silicone resin composition or an acrylic resin.

The silicone resin composition is a resin having satisfactory heat resistance and elasticity which is a silicon compound having a siloxane bond (Si—O—Si). This silicone resin composition can be represented by, for example, the following chemical formula (1) or (2).

(1)

In the formula (1), R represents H or an alkyl group ($C_nH_{2n+1}$-: n represents an integer).

(2)

In the formula (2), R represents H or an alkyl group $C_nH_{2n+1}$-: n represents an integer).

As the silicone resin, in particular, a silicone resin having a thermal curing temperature of 70° C. or higher and 140° C. or lower is preferable.

Here, it is not preferable that the thermal curing temperature is lower than 70° C. because when the electrostatic chuck portion 11 and the heater element 15 on the cooling base portion 12 are adhered to each other in a state of being opposite to each other, curing starts in the process of adhesion, and workability is poor. On the other hand, it is not preferable that the thermal curing temperature is higher than 140° C. because stress between the insulating member 20 of the electrostatic chuck portion 11, the cooling base portion 12, and the insulating member 14 increases due to a large difference in thermal expansion between the insulating member 20 of the electrostatic chuck portion 11, the cooling base portion 12 and the insulating member 14, which may cause peeling therebetween.

As the silicone resin, a resin having a Young's modulus after curing of 8 MPa or lower is preferable. Here, it is not preferable that the Young's modulus after curing is higher than 8 MPa because, when the organic adhesive layer 16 undergoes a heat cycle of temperature rise and temperature fall, a difference in thermal expansion between the insulating member 20 of the electrostatic chuck portion 11 and the cooling base portion 12 cannot be absorbed, and the durability of the organic adhesive layer 16 deteriorates.

It is preferable that the organic adhesive layer 16 contains a filler having an average particle size of 1 μm or more and 10 μm or less formed of an inorganic oxide, an inorganic nitride, or an inorganic oxynitride, for example, surface-coated aluminum nitride (AlN) particles formed by forming a coating layer formed of silicon oxide ($SiO_2$) on surfaces of aluminum nitride (AlN) particles or aluminum oxide ($Al_2O_3$) particles.

The surface-coated aluminum nitride (AlN) particles are incorporated in order to improve the thermal conductivity of the silicone resin, and by adjusting a mix rate thereof, a heat transfer coefficient of the organic adhesive layer 16 can be controlled.

That is, by increasing the mix rate of the surface-coated aluminum nitride (AlN) particles, the heat transfer coefficient of the organic adhesive constituting the organic adhesive layer 16 can be increased.

In addition, since the coating layer formed of silicon oxide ($SiO_2$) is formed on the surfaces of the aluminum nitride (AlN) particles, water resistance is higher than that of aluminum nitride (AlN) particles having non-coated surfaces. Accordingly, the durability of the organic adhesive layer 16 containing a silicone resin composition as a major component can be secured. As a result, the durability of the electrostatic chuck device 1 can be significantly improved.

In addition, in the surface-coated aluminum nitride (AlN) particles, the surfaces of the aluminum nitride (AlN) particles are coated with the coating layer formed of silicon oxide ($SiO_2$) having satisfactory water resistance. Therefore, there is no concern that aluminum nitride (AlN) is hydrolyzed in air, there is no concern that the heat transfer coefficient of aluminum nitride (AlN) is decreased, and the durability of the organic adhesive layer 16 is improved.

The surface-coated aluminum nitride (AlN) particles has no concern of being a contamination source in the plate-shaped sample such as a semiconductor wafer. From this point of view, it can be said that the surface-coated aluminum nitride (AlN) particles are preferable as a filler.

The surface-coated aluminum nitride (AlN) particles can obtain a strong binding state through Si in the coating layer and the silicone resin composition. Therefore, the elongation of the organic adhesive layer 16 can be improved. As a result, thermal stress generated by a difference between a thermal expansion coefficient of the insulating member 20 of the electrostatic chuck portion 11 and a thermal expansion coefficient of the cooling base portion 12 can be relaxed, and the electrostatic chuck portion 11 and the cooling base portion 12 can be adhered to each other accurately and strongly. In addition, since durability to heat cycle load during use is sufficient, the durability of the electrostatic chuck device 10 is improved.

An average particle size of the surface-coated aluminum nitride (AlN) particles is preferably 1 μm or more and 10 μm or less and more preferably 2 μm or more and 5 μm or less.

Here, it is not preferable that the average particle size of the surface-coated aluminum nitride (AlN) particles is less than 1 μm because contact between the particles is insufficient. As a result, the heat transfer coefficient may decrease. In addition, an excessively small particle size causes a decrease in workability such as handleability. On the other hand, it is not preferable that the average particle size is more than 10 μm because the thickness of the adhesive layer is likely to vary.

In addition, in the organic adhesive layer 16, a thermally curable acrylic resin adhesive having a Young's modulus of 1 GPa or lower and flexibility (Shore hardness: 100 or lower) may be formed. In this case, the filler may be added or may not be added.

In the electrostatic chuck device 10 according to the embodiment, the placement plate 17 is formed of the corrosion-resistant member according to the embodiment. Therefore, the placement plate 17 has high corrosion resistance to halogen corrosive gas and plasma thereof, a high dielectric constant, high volume resistivity, and low dielectric loss. That is, in the electrostatic chuck device 10 according to the embodiment, corrosion resistance to halogen corrosive gas and plasma thereof is high, and adsorption of the plate-shaped sample such as a semiconductor wafer is also high.

EXAMPLES

Hereinafter, the present invention will be described in detail using Examples and Comparative Examples, but is not limited to the following examples.

Examples 1 to 3

Commercially available aluminum oxide ($Al_2O_3$) powder, commercially available samarium oxide ($Sm_2O_3$) powder, and commercially available yttrium oxide ($Y_2O_3$) powder were prepared, all the powders having a purity of 99.9% and an average primary particle size of 1.0 μm. These powders were weighed and adjusted so as to obtain a composition shown in Table 1. Next, the powders were mixed with each other through a wet process in ethanol as a solvent using a planetary ball mill and were granulated using a spray dry method. As a result, mixed powders (Nos. 1 to 3) were prepared.

Next, these mixed powders (Nos. 1 to 3) were pre-calcinated in air at 1500° C. for 4 hours and then were crushed into an average particle size of 100 μm or less. The powders were formed into a predetermined shape using known forming means.

Next, the obtained compacts were degreased in a vacuum and then were press-calcinated through hot press in air at 1600° C. for 2 hours. As a result, composite oxide sintered compacts were prepared. At this time, the welding pressure was 200 kg/cm$^2$.

Examples 4 to 14

Commercially available aluminum oxide ($Al_2O_3$) powder, commercially available samarium oxide ($Sm_2O_3$) powder, and one kind selected from the group consisting of commercially available yttrium oxide ($Y_2O_3$) powder, commercially available lanthanum oxide ($La_2O_3$) powder, commercially available lanthanum oxide ($La_2O_3$) powder, commercially available praseodymium oxide ($Pr_2O_3$) powder, commercially available neodymium oxide ($Nd_2O_3$) powder, commercially available europium oxide ($Eu_2O_3$)

powder, commercially available gadolinium oxide ($Gd_2O_3$) powder, commercially available terbium oxide ($Tb_2O_3$) powder, commercially available dysprosium oxide ($Dy_2O_3$) powder, commercially available holmium oxide ($Ho_2O_3$) powder, commercially available erbium oxide ($Er_2O_3$) powder, and commercially available thulium oxide ($Tm_2O_3$) powder were prepared, all the powders having a purity of 99.9% and an average primary particle size of 1.0 μm. These powders were weighed and adjusted so as to obtain a composition shown in Table 1. Next, the powders were mixed with each other through a wet process in ethanol as a solvent using a planetary ball mill and were granulated using a spray dry method. As a result, mixed powders (Nos. 4 to 14) were obtained.

Next, these mixed powders (Nos. 4 to 14) were pre-calcinated in air at 1500° C. for 4 hours and then were crushed into an average particle size of 100 μm or less. The powders were formed into a predetermined shape using known forming means.

Next, the obtained compacts were degreased in a vacuum and then were press-calcinated through hot press in air at 1600° C. for 2 hours. As a result, composite oxide sintered compacts were prepared. At this time, the welding pressure was 200 kg/cm².

Comparative Examples 1 to 6

Commercially available aluminum oxide ($Al_2O_3$) powder, commercially available samarium oxide ($Sm_2O_3$) powder, and one kind selected from the group consisting of commercially available yttrium oxide ($Y_2O_3$) powder, commercially available scandium oxide ($Sc_2O_3$) powder, and commercially available cerium oxide ($Ce_2O_3$) powder were prepared, all the powders having a purity of 99.9% and an average primary particle size of 1.0 μm. These powders were weighed and adjusted so as to obtain a composition shown in Table 1. Next, the powders were mixed with each other through a wet process in ethanol as a solvent using a planetary ball mill and were granulated using a spray dry method. As a result, mixed powders (Nos. 15 to 20) were obtained.

Next, these mixed powders (Nos. 15 to 20) were pre-calcinated in air at 1500° C. for 4 hours and then were crushed into an average particle size of 100 μm or less. The powders were formed into a predetermined shape using known forming means.

Next, the obtained compacts were degreased in a vacuum and then were press-calcinated through hot press in air at 1600° C. for 2 hours. As a result, composite oxide sintered compacts were prepared. At this time, the welding pressure was 200 kg/cm².

[Evaluation]

Each of the sintered compacts according to Examples 1 to 14 and Comparative Examples 1 to 6 was evaluated. The evaluation results are shown in Table 1.

The evaluation items and the evaluation methods are as follows.

(1) Dielectric Constant and Dielectric Loss

Regarding each of the sintered compacts according to Examples 1 to 14 and Comparative Examples 1 to 6, a dielectric constant in a frequency region of 40 Hz to 1 MHz was measured using a frequency measuring device (trade name: Agilent 4294A, precision impedance analyzer, manufactured by Agilent Technologies).

As the sintered compact, a compact processed into a size of length 60 mm×width 60 mm×thickness 2 mm was used.

(2) Volume Resistivity

The volume resistivity was measured using a resistivity meter LORESTA GP (manufactured by Mitsubishi Chemical Analytech Co., Ltd.) at a measurement voltage of 10 V according to four point measurements.

(3) Volume Density

A true density ($d_0$) of the sintered compact was measured using the Archimedes' principle. A ratio ($d_0/d_t$) of the true density ($d_0$) to a theoretical density ($d_t$) was expressed by percent and was set as a volume density (relative density, %).

(4) Adsorption Force

The sintered compact was processed into a thickness of 1 mm. Alumina ceramic, an electrode, and the sintered compact were adhered and laminated in this order, a temperature of a placement surface of the sintered compact was set to 25° C., and a direct current voltage of 1.5 kV was applied to the placement surface of the sintered compact for 60 seconds. In a vacuum (<0.5 Pa), an adsorption force to a 1-inch silicon wafer was measured.

In the measurement of the adsorption force, the silicon wafer was peeled from the placement surface of the sintered compact using a load cell during the voltage application. At this time, the maximum peeling stress was set as an adsorption force.

(5) Residual Adsorption Force

The sintered compact was processed into a thickness of 1 mm. Alumina ceramic, an electrode, and the sintered compact were adhered and laminated in this order, a temperature of a placement surface of the sintered compact was set to 25° C. in a vacuum (<0.5 Pa), and a direct current voltage of 5.0 kV was applied to the placement surface of the sintered compact for 60 seconds. Next, immediately after releasing the voltage application, an adsorption force to a 1-inch silicon wafer was measured.

In the measurement of the residual adsorption force, the silicon wafer was peeled from the placement surface of the sintered compact using a load cell immediately after releasing the voltage application. At this time, the maximum peeling stress was set as a residual adsorption force.

(6) Identification of Crystal Phase of Sintered Compact

Using a powder X-ray diffractometer (trade name: X' Pert PRO MPD, manufactured by PANalytical B.V), the crystal phase was identified by powder X-ray diffraction.

In Table 1, O represents an orthorhombic perovskite phase, Y represents a yttrium aluminum garnet ($5Al_2O_3 \cdot 3Y_2O_3$) crystal phase, RE represents a rare earth metal element other than samarium (Sm), M represents a monoclinic crystal, and G represents a garnet type crystal phase.

(7) Consumption Rate (Etching Rate) of Sintered Compact

A plate-shaped body having a size of 10 mm×10 mm×5 mm was cut from a sample, and one surface of the plate-shaped body was mirror-polished. As a result, a specimen having the polished surface as a test surface was prepared. Next, this specimen was cleaned with acetone, the weight thereof was measured, and the specimen was put into a chamber of a plasma etching device. Next, $CF_4$ gas and microwaves (100 W) were introduced into the chamber to generate $CF_4$ plasma, and each specimen was exposed to the $CF_4$ plasma. Next, after the exposure, the weight of the specimen was measured, a consumption rate (etching rate) was calculated based on a weight change after exposure to evaluate corrosion resistance.

Exposure conditions were atmosphere pressure: 11 torr, exposure time: 10 minutes, and exposure temperature: 900° C.

TABLE 1

| Added Rare Earth Metal Oxide | Mixing Ratio (mol. %) | | | NRE/ (NSM + NRE) | Dielectric Constant | | Dielectric Loss | | Volume Resistivity ($\Omega \cdot$ cm) | Density of Sintered Compact (%) |
|---|---|---|---|---|---|---|---|---|---|---|
| | $RE_2O_3$ | $Sm_2O_3$ | $Al_2O_3$ | | 40 Hz | 1 MHz | 40 Hz | 1 MHz | | |
| Example 1 | $Y_2O_3$ 10 | 40 | 50 | 0.2 | 15.3 | 18.2 | 0.020 | 0.020 | 4.2E+15 | 99.5 |
| Example 2 | $Y_2O_3$ 1 | 49 | 50 | 0.02 | 16.4 | 30.1 | 0.180 | 0.160 | 1.4E+15 | 99.3 |
| Example 3 | $Y_2O_3$ 25 | 25 | 50 | 0.5 | 14.2 | 17.5 | 0.015 | 0.013 | 3.1E+15 | 99.4 |
| Example 4 | $La_2O_3$ 25 | 25 | 50 | 0.5 | 14.9 | 18.4 | 0.016 | 0.014 | 3.2E+15 | 99.8 |
| Example 5 | $Pr_2O_3$ 25 | 25 | 50 | 0.5 | 14.8 | 18.2 | 0.016 | 0.014 | 3.8E+15 | 99.7 |
| Example 6 | $Nd_2O_3$ 25 | 25 | 50 | 0.5 | 14.3 | 17.7 | 0.015 | 0.013 | 7.8E+14 | 99.7 |
| Example 7 | $Eu_2O_3$ 25 | 25 | 50 | 0.5 | 14.5 | 17.9 | 0.015 | 0.013 | 7.9E+14 | 99.5 |
| Example 8 | $Gd_2O_3$ 25 | 25 | 50 | 0.5 | 14.1 | 17.3 | 0.015 | 0.013 | 8.8E+14 | 98.4 |
| Example 9 | $Tb_2O_3$ 25 | 25 | 50 | 0.5 | 13.9 | 17.2 | 0.015 | 0.013 | 1.3E+15 | 99.3 |
| Example 10 | $DY_2O_3$ 25 | 25 | 50 | 0.5 | 13.8 | 17.0 | 0.015 | 0.013 | 2.7E+15 | 99.1 |
| Example 11 | $Ho_2O_3$ 25 | 25 | 50 | 0.5 | 13.6 | 16.8 | 0.014 | 0.012 | 1.9E+15 | 99.4 |
| Example 12 | $Er_2O_3$ 25 | 25 | 50 | 0.5 | 13.5 | 16.6 | 0.014 | 0.012 | 9.9E+14 | 99.8 |
| Example 13 | $Tm_2O_3$ 25 | 25 | 50 | 0.5 | 13.3 | 16.5 | 0.014 | 0.012 | 8.7E+14 | 99.3 |
| Example 14 | $Y_2O_3$ 12.5 $La_2O_3$ 12.5 | 25 | 50 | 0.5 | 14.6 | 18.0 | 0.080 | 0.075 | 9.6E+14 | 99.4 |
| Comparative Example 1 | $Y_2O_3$ 0 | 50 | 50 | 0 | 17.2 | 38.6 | 0.250 | 0.310 | 3.7E+14 | 99.6 |
| Comparative Example 2 | $Y_2O_3$ 27 | 23 | 50 | 0.54 | 11.5 | 12.0 | 0.018 | 0.012 | 2.1E+15 | 99.3 |
| Comparative Example 3 | $Y_2O_3$ 50 | 0 | 50 | 1 | 11.4 | 11.2 | 0.050 | 0.070 | 1.4E+14 | 99.9 |
| Comparative Example 4 | $Sc_2O_3$ 25 | 25 | 50 | 0.5 | 13.2 | 14.9 | 0.130 | 0.115 | 7.7E+13 | 99.2 |
| Comparative Example 5 | $CeO_2$ 25 | 25 | 50 | 0.5 | 12.9 | 14.3 | 0.102 | 0.099 | 8.3E+13 | 99.6 |
| Comparative Example 6 | $Y_2O_3$ 37.5 | 0 | 62.5 | | 7.1 | 10.7 | 0.020 | 0.010 | 1.50E+14 | 99.7 |

| | Adsorption Force | | Residual Adsorption Force | | Lattice Constant | | | Crystal Phase | Consumption Rate (μm/hr) |
|---|---|---|---|---|---|---|---|---|---|
| | +3 kV | −3 kV | +3 kV | −3 kV | a | b | c | | |
| Example 1 | 21.0 | 18.0 | 0.5 | 0.4 | 5.278 | 5.283 | 7.470 | O | 0.036 |
| Example 2 | 29.0 | 21.0 | 0.9 | 0.8 | 5.284 | 5.289 | 7.472 | O | 0.03 |
| Example 3 | 13.2 | 12.3 | 0.4 | 0.4 | 5.270 | 5.272 | 7.470 | O, RE | 0.05 |
| Example 4 | 13.9 | 12.9 | 0.5 | 0.4 | 5.343 | 5.346 | 7.547 | O, RE | 0.05 |
| Example 5 | 13.7 | 12.8 | 0.4 | 0.5 | 5.315 | 5.319 | 7.521 | O, RE | 0.05 |
| Example 6 | 13.3 | 12.4 | 0.4 | 0.4 | 5.303 | 5.305 | 7.509 | O, RE | 0.04 |
| Example 7 | 13.5 | 12.5 | 0.5 | 0.5 | 5.294 | 5.296 | 7.496 | O, RE | 0.05 |
| Example 8 | 13.1 | 12.2 | 0.4 | 0.4 | 5.289 | 5.290 | 7.492 | O, RE | 0.04 |
| Example 9 | 12.9 | 12.1 | 0.4 | 0.5 | 5.281 | 5.284 | 7.470 | O, RE | 0.05 |
| Example 10 | 12.8 | 11.9 | 0.5 | 0.4 | 5.272 | 5.278 | 7.461 | O, RE | 0.05 |
| Example 11 | 12.7 | 11.8 | 0.5 | 0.4 | 5.257 | 5.265 | 7.444 | O, RE | 0.05 |
| Example 12 | 12.5 | 11.7 | 0.4 | 0.5 | 5.244 | 5.251 | 7.436 | O, RE | 0.05 |
| Example 13 | 12.4 | 11.6 | 0.4 | 0.4 | 5.201 | 5.233 | 7.416 | O, RE | 0.05 |
| Example 14 | 11.8 | 11.5 | 0.4 | 0.4 | 5.301 | 5.309 | 7.502 | O, RE | 0.05 |
| Comparative Example 1 | 41.0 | 43.0 | 2.8 | 0.6 | 5.285 | 5.291 | 7.473 | O | 0.03 |
| Comparative Example 2 | 9.1 | 8.6 | 0.5 | 0.6 | 5.271 | 5.274 | 7.471 | O, RE | 0.05 |
| Comparative Example 3 | 7.3 | 6.4 | 0.6 | 0.5 | 5.179 | 5.327 | 7.370 | Y | 6.3 |
| Comparative Example 4 | 23.5 | 21.2 | 3.5 | 2.1 | 5.180 | 5.192 | 7.460 | O, M | 0.05 |
| Comparative Example 5 | 19.9 | 19.3 | 1.9 | 1.1 | 5.193 | 5.199 | 7.328 | O, M | 0.05 |
| Comparative Example 6 | 8.5 | 7.4 | 0.5 | 0.5 | 12.0089 | 12.0089 | 12.0089 | G | 8.1 |

O: Orthorhombic $SmAlO_3$
Y: $YAlO_3$
Re: Rare Earth Metal Element Other Than Samarium
M: Monoclinic Crystal
G: Garnet Structure From the results of Table 1, it was verified that, in the sintered compacts according to Examples 1 to 14, the crystal phase was an orthorhombic perovskite phase, and the lattice constant satisfied a=$5.200\times10^{-10}$ m or more and $5.350\times10^{-10}$ m or less, b=$5.200\times10^{-10}$ m or more and $5.350\times10^{-1}$ m or less, and c=$7.400\times10^{10}$ m or more and $7.550\times10^{10}$ m or less. In addition, it was verified that, in the sintered compacts according to Examples 1 to 14, the dielectric constant at frequencies of 40 Hz and 1 MHz was 13 or higher, the dielectric loss at frequencies of 40 Hz and 1 MHz was 0.2 or lower, and the volume resistivity was $1\times10^{14}$ Ω·cm or higher. Further, it was verified that, in the sintered compacts according to Examples 1 to 14, the adsorption force was 12 kPa or higher, and the residual adsorption force was 0.9 kPa or lower. That is, it was verified that, in the sintered compacts according to Examples 1 to 14, sufficient adsorption force was exhibited during voltage application and that the sample was able to be easily peeled off after releasing the voltage application. Further, it was verified that the consumption rate to the etching gas plasma was lower than 0.1 μm/hr and that sufficient plasma resistance was exhibited.

INDUSTRIAL APPLICABILITY

The corrosion-resistant member according to the present invention is formed of a composite oxide sintered compact containing aluminum, samarium, and a rare earth metal element other than samarium, in which the rare earth metal element other than samarium has an ionic radius of $0.88\times10^{-10}$ m or more. Therefore, dielectric constant and volume resistivity are high, and dielectric loss is low. As a result, using this corrosion-resistant member, an electrostatic chuck device having high adsorption force and low residual adsorption force can be prepared.

REFERENCE SIGNS LIST

10: ELECTROSTATIC CHUCK DEVICE
11: ELECTROSTATIC CHUCK PORTION
12: COOLING BASE PORTION
13: ADHESIVE
14: INSULATING MEMBER
15: HEATER ELEMENT (HEATING MEMBER)
16: ORGANIC ADHESIVE LAYER
17: PLACEMENT PLATE
18: INTERNAL ELECTRODE FOR ELECTROSTATIC ADSORPTION
19: ADHESIVE
20: INSULATING MEMBER
21: POWER FEEDING TERMINAL
22: ELECTRODE
23: INSULATOR
24: CONDUCTIVE ADHESIVE
25: ELECTRODE
26: INSULATOR

The invention claimed is:

1. A corrosion-resistant member comprising a composite oxide sintered compact containing aluminum, samarium, and a rare earth metal element other than samarium,
wherein the rare earth metal element other than samarium has an ionic radius of $0.88\times10^{-10}$ m or more, and
a crystal phase of the composite oxide sintered compact is (i) an orthorhombic perovskite phase or (ii) an orthorhombic perovskite phase and a rare earth metal element other than samarium.

2. The corrosion-resistant member according to claim 1, wherein a ratio ($N_{RE}/(N_{SM}+N_{RE})$) of the number of atoms of the rare earth metal element other than samarium ($N_{RE}$) to the sum ($N_{SM}+N_{RE}$) of the number of atoms of samarium ($N_{SM}$) and the number of atoms of the rare earth metal element other than samarium ($N_{RE}$) in the composite oxide is 0.01 or higher and 0.5 or lower.

3. The corrosion-resistant member according to claim 1, wherein the rare earth metal element other than samarium is one element or two or more elements selected from the group consisting of yttrium, lanthanum, praseodymium, neodymium, europium, gadolinium, terbium, dysprosium, holmium, erbium, and thulium.

4. The corrosion-resistant member according to claim 1, wherein a dielectric constant at a frequency of 1 MHz or lower is 13 or higher,
a dielectric loss at a frequency of 1 MHz or lower is 0.2 or lower, and
volume resistivity is $1\times10^{14}$ Ω·cm or higher.

5. An electrostatic chuck device comprising:
a ceramic plate-shaped body that has a first main surface which is a placement surface on which a sample is placed; and
an internal electrode for electrostatic adsorption that is provided on a second main surface of the ceramic plate-shaped body,
wherein the ceramic plate-shaped body is formed of the corrosion-resistant member according to claim 1.

6. The electrostatic chuck device according to claim 5, further comprising:
a cooling base portion that cools the ceramic plate-shaped body and the internal electrode for electrostatic adsorption; and
a heating member that is provided between the internal electrode for electrostatic adsorption and the cooling base portion.

* * * * *